(12) United States Patent
Lindsay et al.

(10) Patent No.: US 9,059,141 B2
(45) Date of Patent: Jun. 16, 2015

(54) BURIED GATE TRANSISTOR

(71) Applicant: Infineon Technologies AG, Neubiberg (DE)

(72) Inventors: Richard Lindsay, Beacon, NY (US); Matthias Hierlemann, Fishkill, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/665,448

(22) Filed: Oct. 31, 2012

(65) Prior Publication Data
US 2013/0059424 A1 Mar. 7, 2013

Related U.S. Application Data

(62) Division of application No. 11/175,835, filed on Jul. 6, 2005, now Pat. No. 8,338,887.

(51) Int. Cl.
*H01L 21/336* (2006.01)
*H01L 29/423* (2006.01)
*H01L 29/66* (2006.01)
(Continued)

(52) U.S. Cl.
CPC .... *H01L 29/42356* (2013.01); *H01L 29/66613* (2013.01); *H01L 29/66575* (2013.01); *H01L 21/26586* (2013.01); *H01L 21/28097* (2013.01); *H01L 21/28194* (2013.01); *H01L 21/823807* (2013.01); *H01L 21/823828* (2013.01); *H01L 21/823885* (2013.01); *H01L 27/10876* (2013.01); *H01L 29/1083* (2013.01); *H01L 29/495* (2013.01); *H01L 29/4966* (2013.01); *H01L 29/517* (2013.01); *H01L 29/518* (2013.01); *H01L 29/665* (2013.01);
(Continued)

(58) Field of Classification Search
CPC ............. H01L 29/6659; H01L 29/66575; H01L 29/66613
USPC ............. 257/330–334, E29.26, E21.384, 257/E21.419, E21.428, E21.433, E21.429; 438/199, 259, 270
See application file for complete search history.

(56) References Cited

U.S. PATENT DOCUMENTS 4,786,960 A 11/1988 Jeuch
5,021,359 A 6/1991 Young et al.
(Continued)

FOREIGN PATENT DOCUMENTS

DE 4212829 A1 11/1992
DE 1020 0400 550 9/2004
(Continued)

*Primary Examiner* — Robert Huber
(74) *Attorney, Agent, or Firm* — Slater & Matsil, L.L.P.

(57) ABSTRACT

An embodiment of the invention provides a semiconductor fabrication method. The method comprises forming an isolation region between a first and a second region in a substrate, forming a recess in the substrate surface, and lining the recess with a uniform oxide. Embodiments further include doping a channel region under the bottom recess surface in the first and second regions and depositing a gate electrode material in the recess. Preferred embodiments include forming source/drain regions adjacent the channel region in the first and second regions, preferably after the step of depositing the gate electrode material. Another embodiment of the invention provides a semiconductor device comprising a recess in a surface of the first and second active regions and in the isolation region, and a dielectric layer having a uniform thickness lining the recess.

13 Claims, 6 Drawing Sheets

(51) Int. Cl.
*H01L 21/265* (2006.01)
*H01L 21/28* (2006.01)
*H01L 21/8238* (2006.01)
*H01L 27/108* (2006.01)
*H01L 29/10* (2006.01)
*H01L 29/49* (2006.01)
*H01L 29/51* (2006.01)
*H01L 27/088* (2006.01)

(52) U.S. Cl.
CPC ..... *H01L 29/6659* (2013.01); *H01L 29/66621* (2013.01); *H01L 27/088* (2013.01)

(56) References Cited

U.S. PATENT DOCUMENTS

| | | | |
|---|---|---|---|
| 5,270,257 A | 12/1993 | Shin | |
| 5,366,911 A | 11/1994 | Lur et al. | |
| 5,371,024 A | 12/1994 | Hieda et al. | |
| 5,380,671 A | 1/1995 | Lur et al. | |
| 5,486,714 A | 1/1996 | Hong | |
| 5,502,320 A * | 3/1996 | Yamada | 257/302 |
| 5,506,431 A | 4/1996 | Thomas | |
| 5,563,801 A | 10/1996 | Lee et al. | |
| 5,610,422 A | 3/1997 | Yanagiya et al. | |
| 5,683,924 A | 11/1997 | Chan et al. | |
| 5,726,088 A | 3/1998 | Yanagiya et al. | |
| 5,734,603 A | 3/1998 | Tai | |
| 5,783,478 A | 7/1998 | Chau et al. | |
| 5,818,098 A | 10/1998 | Davies et al. | |
| 5,914,553 A | 6/1999 | Adams et al. | |
| 5,953,602 A | 9/1999 | Oh et al. | |
| 5,994,736 A | 11/1999 | Sugawara et al. | |
| 5,998,835 A | 12/1999 | Furukawa et al. | |
| 6,002,151 A | 12/1999 | Liu et al. | |
| 6,087,235 A * | 7/2000 | Yu | 438/300 |
| 6,093,947 A | 7/2000 | Hanafi et al. | |
| 6,097,061 A | 8/2000 | Liu et al. | |
| 6,169,003 B1 * | 1/2001 | Hu et al. | 438/299 |
| 6,214,670 B1 | 4/2001 | Shih et al. | |
| 6,239,472 B1 | 5/2001 | Shenoy | |
| 6,303,448 B1 | 10/2001 | Chang et al. | |
| 6,333,230 B1 | 12/2001 | Bryant et al. | |
| 6,355,955 B1 * | 3/2002 | Gardner et al. | 257/330 |
| 6,358,800 B1 | 3/2002 | Tseng | |
| 6,373,102 B1 * | 4/2002 | Huang | 257/345 |
| 6,391,720 B1 | 5/2002 | Sneelal et al. | |
| 6,413,829 B1 * | 7/2002 | Yu | 438/311 |
| 6,465,311 B2 | 10/2002 | Shenoy | |
| 6,531,380 B2 * | 3/2003 | Li et al. | 438/579 |
| 6,555,872 B1 | 4/2003 | Dennen | |
| 6,570,218 B1 | 5/2003 | Bol | |
| 6,580,137 B2 | 6/2003 | Parke | |
| 6,642,130 B2 | 11/2003 | Park | |
| 6,660,598 B2 | 12/2003 | Hanafi et al. | |
| 6,670,680 B2 | 12/2003 | Nohsoh et al. | |
| 6,693,026 B2 * | 2/2004 | Kim | 438/589 |
| 6,747,318 B1 | 6/2004 | Kapre et al. | |
| 6,780,732 B2 | 8/2004 | Durcan et al. | |
| 6,841,831 B2 | 1/2005 | Hanafi et al. | |
| 6,897,114 B2 | 5/2005 | Krueger et al. | |
| 6,908,801 B2 | 6/2005 | Saito | |
| 6,924,529 B2 | 8/2005 | Kim et al. | |
| 6,963,108 B1 | 11/2005 | Kang et al. | |
| 7,148,527 B2 | 12/2006 | Kim et al. | |
| 7,279,368 B2 | 10/2007 | Harris et al. | |
| 7,295,088 B2 | 11/2007 | Nguyen et al. | |
| 7,326,975 B2 | 2/2008 | Kim et al. | |
| 7,427,546 B2 | 9/2008 | Park | |
| 7,569,456 B2 | 8/2009 | Ko et al. | |
| 7,639,104 B1 | 12/2009 | Quevy et al. | |
| 7,659,573 B2 | 2/2010 | Kim et al. | |
| 2001/0025973 A1 | 10/2001 | Yamada et al. | |
| 2002/0034865 A1 | 3/2002 | Umimoto et al. | |
| 2002/0056871 A1 | 5/2002 | Kocon et al. | |
| 2002/0060339 A1 | 5/2002 | Maruoka | |
| 2002/0140022 A1 * | 10/2002 | Lin et al. | 257/315 |
| 2002/0182814 A1 * | 12/2002 | Hu et al. | 438/306 |
| 2002/0197810 A1 | 12/2002 | Hanafi et al. | |
| 2003/0011027 A1 | 1/2003 | Zeng et al. | |
| 2003/0040154 A1 | 2/2003 | Durcan et al. | |
| 2003/0132484 A1 | 7/2003 | Deleonibus | |
| 2003/0151091 A1 | 8/2003 | Palm et al. | |
| 2003/0189228 A1 * | 10/2003 | Ieong et al. | 257/347 |
| 2004/0014590 A1 | 1/2004 | Horhota et al. | |
| 2004/0036114 A1 * | 2/2004 | Taylor et al. | 257/330 |
| 2004/0089892 A1 * | 5/2004 | Suzuki | 257/302 |
| 2004/0104433 A1 | 6/2004 | Ieong et al. | |
| 2004/0119117 A1 | 6/2004 | Kushida | |
| 2004/0135176 A1 | 7/2004 | Kim | |
| 2004/0169221 A1 | 9/2004 | Ko et al. | |
| 2004/0188725 A1 | 9/2004 | Fujiwara et al. | |
| 2004/0191971 A1 | 9/2004 | Bol | |
| 2004/0222457 A1 * | 11/2004 | Kim et al. | 257/328 |
| 2005/0001319 A1 | 1/2005 | Hackler, Sr. et al. | |
| 2005/0014338 A1 | 1/2005 | Kim et al. | |
| 2005/0085043 A1 * | 4/2005 | Enders et al. | 438/289 |
| 2005/0087776 A1 | 4/2005 | Kim | |
| 2005/0090068 A1 | 4/2005 | Park | |
| 2005/0136616 A1 | 6/2005 | Cho et al. | |
| 2006/0049455 A1 | 3/2006 | Jang et al. | |
| 2007/0007571 A1 | 1/2007 | Lindsay et al. | |
| 2009/0008692 A1 | 1/2009 | Lin et al. | |

FOREIGN PATENT DOCUMENTS

| | | |
|---|---|---|
| JP | 04-335538 JP | 11/1992 |
| JP | 05-343676 | 12/1993 |
| JP | 6-244415 A | 9/1994 |
| JP | 06-268174 | 9/1994 |
| JP | 6342806 A | 12/1994 |
| JP | 07-153952 | 6/1995 |
| JP | 11-74527 A | 3/1999 |
| JP | 2000-208762 | 7/2000 |
| JP | 2001-036079 | 2/2001 |
| JP | 2002-184957 A | 6/2002 |
| JP | 2003-133546 A | 5/2003 |
| JP | 2003-179223 | 6/2003 |
| JP | 2003-298048 | 10/2003 |
| JP | 2004-014590 | 1/2004 |
| JP | 2004-517466 A | 6/2004 |

* cited by examiner

BURIED GATE TRANSISTOR

This application is a divisional of U.S. patent application Ser. No. 11/175,835, filed on Jul. 6, 2005, entitled "Buried Gate Transistor," which application is hereby incorporated herein by reference.

TECHNICAL FIELD

This invention relates generally to semiconductor device manufacturing and more particularly to a buried gate transistor for use in a semiconductor device.

BACKGROUND

Integrated circuits, such as ultra-large scale integrated (ULSI) circuits, can include as many as one billion transistors or more. Most typically, ULSI circuits are formed of Field Effect Transistors (FETs) formed in a Complementary Metal Oxide Semiconductor (CMOS) process. Each MOSFET includes a gate electrode formed over a channel region of the semiconductor substrate, which runs between a drain region and source region.

To increase the device density and operation speed of the integrated circuits, the feature size of transistor within the circuits must be reduced. However, with the continued reduction in device size, sub-micron scale MOS transistors have to overcome many technical challenges. As the MOS transistors become smaller and their channel length decreases, problematic short channel effects (SCEs), such as, source to drain leakage become more pronounced.

One solution to decrease the physical dimension of ULSI circuits is to form recessed or buried gate transistors, which have a gate electrode buried in a substrate recess or trench. Such an architecture allows for greater circuit density due to less topography above the silicon surface, thereby creating less ground rule restrictions, and by allowing junction profiles typically on the silicon plane to form on the vertical side of the gate, e.g., source/drain extensions formed under the spacer.

This type of transistor reduces SCEs by increasing the average separation of source and drain without increasing the channel length. By using a vertical dimension, such a structure can also be used to allow a greater overlap of the source/drain under the gate without bringing the source and drain closer. As such the on-state current is increased while the SCEs are not degraded. However, effectively forming recessed gate transistors has been a difficult task.

To reduce SCEs, junction depths are reduced laterally (and vertically) under the gate. However, the reduction of this overlap region (measured by overlap capacitance, $C_{ov}$) greatly increases the resistance at that point, thereby reducing the on-state current ($I_{on}$) and performance of the device. With conventional surface-gates in advanced devices, achieving good SCEs degrades the $I_{on}$ due to this lack of overlap.

In light of such problems, alternative structures are required to break this $C_{ov}$-SCEs compromise. There is also a need for these structures to be readily integratable to constitute such a change in MOSFET architecture.

SUMMARY OF THE INVENTION

These and other problems are generally solved or circumvented, and technical advantages are generally achieved, by preferred embodiments of the present invention that provide methods and structures for buried gate transistors having improved immunity to SCEs and also for increasing the junction overlap simultaneously.

An embodiment of the invention provides a semiconductor fabrication method. The method comprises forming an isolation region between a first and a second region in a substrate, forming multiple recesses in the substrate surface, and lining the recess with a uniform oxide. Embodiments further include doping a channel region under the bottom recess surface in the first and second regions separately and depositing a gate electrode material in the recess. Preferred embodiments include forming source/drain regions adjacent the channel region in the first and second regions, preferably after the step of depositing the gate electrode material.

Another embodiment of the invention provides a semiconductor device. Embodiments include a recess in a surface of the first and second active regions and in the isolation region, and a dielectric layer having a uniform thickness lining the recess. Manufacturing the device preferably includes forming source/drain regions adjacent the channel region in the first and second regions, preferably after the step of depositing the gate electrode material.

Yet another embodiment of the invention provides a transistor having a recessed gate electrode and a method of manufacturing thereof.

The foregoing has outlined rather broadly, the features and technical advantages of the present invention in order that the detailed description of the invention that follows may be better understood. Additional features and advantages of the invention will be described hereinafter, which form the subject of the claims of the invention. It should be appreciated, by those skilled in the art, that the conception and specific embodiment disclosed may be readily utilized as a basis for modifying or designing other structures or processes for carrying out the same purposes of the present invention. It should also be realized, by those skilled in the art, that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numbers and symbols in different figures generally refer to corresponding parts unless otherwise indicated. The figures are drawn to clearly illustrate the relevant aspects of the preferred embodiments and are not necessarily drawn to scale. To more clearly illustrate certain embodi-

DETAILED DESCRIPTION OF ILLUSTRATIVE EMBODIMENTS

Figure 1:
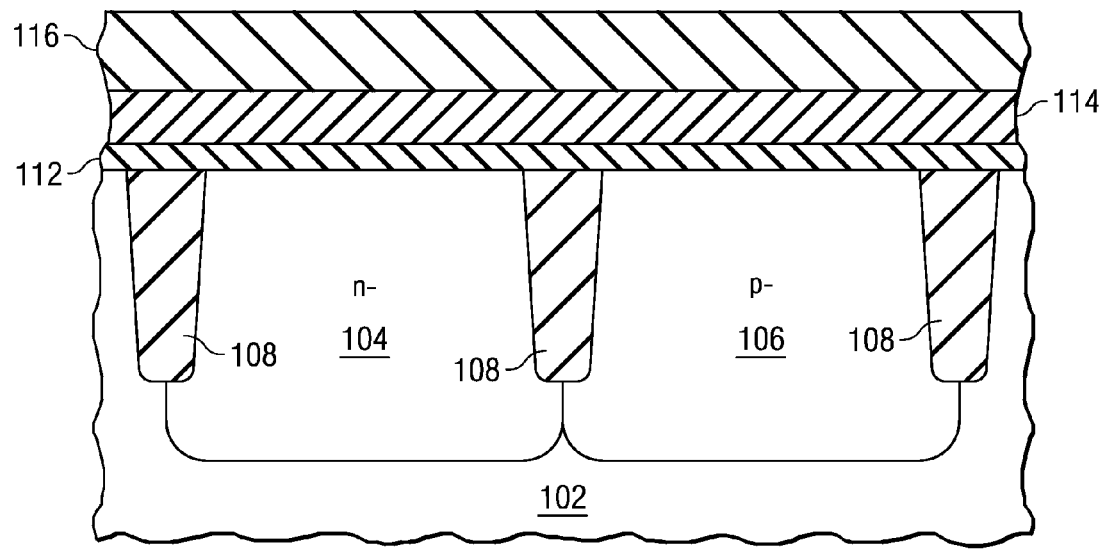
FIG. 1 is a side view illustrating a substrate for forming a buried gate transistor according to an embodiment of the invention.

The making and using of the presently preferred embodiments are discussed in detail below. It should be appreciated, however, that the present invention provides many applicable inventive concepts that may be embodied in a wide variety of specific contexts, which are not to be limited to the exemplary embodiments provided herein.

Embodiments of the invention provide an enabling process flow for simultaneous improvement in short channel effects such as $C_{ov}$ and $I_{off}$. Such a process flow provides several advantages over the prior art. For example, embodiments of the invention include etching of isolation regions to allow a buried gate connecting multiple source/drains or for contacting poly on isolation. This provides multiple benefits, which include less topography problems, simpler process flow (only one CMP), less STI recess variation thereby causing less stress and threshold voltage ($V_t$) variation issues. Embodiments of the invention, also include performing source/drain implants after electrode recess and gate formation. Benefits from this include simultaneous gate and source/drain doping, uniform gate oxide formation since more uniform doping in substrate during oxidation (only well doping).

Unlike conventional methods, wherein recessed gate manufacturing includes source/drain doping before gate formation, embodiments use a thin oxide sidewall to gain $C_{ov}$ vs. SCEs. The gate oxide is the same thickness for channel and source/drain overlap region. Benefits from this include better on-state performance because the source/drain is very highly doped where it meets the channel. For maximum on-state current, this contact between the S/D and channel has to be located at the thinnest oxide, i.e., when $C_{ov}$ is the highest producing the highest number of carriers in the channel.

The invention will now be described with respect to preferred embodiments in a specific context, namely a method for forming a buried gate transistor in a CMOS device. Preferred embodiments of the invention include an isolation region, such as a shallow trench isolation (STI) region, between nMOS and pMOS transistors in a CMOS device. Preferred embodiments of the invention provide a robust manufacturing sequence for forming buried gate electrodes both in the STI and active regions. Preferred embodiments include forming the gate dielectric and gate electrode before performing a source/drain implant.

Unlike conventional methods, which perform the source/drain implant first, embodiments of the invention advantageously avoid processing problems relating to semiconductor recess variation caused by dopant-dependent oxidation and etch rates. These variations, in turn, lead to a non-uniform oxide around the gate. The conventional source/drain-implant first approach, therefore, limits the use and repeatability of buried gate methods and structures. Another advantage achieved with embodiments is that performing the source/drain implant after the gate formation allows for doping of both nMOS and pMOS transistors at the same time as the source/drain. This saves additional mask levels or separate in-situ poly gate doping methods.

The invention will now be described with respect to preferred embodiments in a specific context, namely n-channel and p-channel transistors in a CMOS device. Embodiments of the present invention may also be applied, however, to other semiconductor or integrated circuit applications where one or more recessed gate transistors are utilized. Note that the illustrative embodiments include only one pMOS device and one nMOS device. However, there are typically many (e.g., thousands or millions) pMOS and nMOS devices formed on a semiconductor substrate during each of the manufacturing processes described herein.

Turning now to FIG. 1, there is illustrated an embodiment of the invention, which includes a substrate 102 such as silicon or other semiconductor materials. The substrate 102 may comprise a single crystal silicon substrate or a single crystal silicon layer over another semiconductor (e.g., Si, SiGe, SiC) or an insulator (e.g., a silicon-on-insulator or SOI substrate). Compound or alloy semiconductors, such as GaAs, InP, SiGe, or SiC, as examples, can be used in place of silicon.

The substrate 102 includes a first active area 104 and a second active area 106. In the CMOS example that will be described, a p-channel transistor (pMOS) will be formed in the first active area 104 and an n-channel transistor (nMOS) will be formed in the second active area 106. As such, the first active area 104 is lightly doped with n-type dopants and the second active area 106 is lightly doped with p-type dopants. In other embodiments, other devices can be formed. For example, other nMOS transistors, other pMOS transistors, bipolar transistors, diodes, capacitors, resistors and other devices can be formed in active areas similar to 104 and 106.

As shown in FIG. 1, the first region 104 and the second region 106 are separated by an isolation region, such as shallow trench isolation (STI) region 108, formed in the substrate 102. The STI region 108 is filled with a trench filling material, which may comprise an oxide such as silicon dioxide. In one embodiment, the oxide is deposited using a high density plasma (HDP) process. In another embodiment, the oxide can be deposited by the decomposition of tetraethyloxysilane (TEOS). In other embodiments, other materials can be used. For example, a trench filling material may be amorphous or polycrystalline (doped or undoped) silicon or a nitride such as silicon nitride. In other embodiments (not illustrated), sidewalls of the trench of the STI region 108 may include a liner. For example, an oxide and/or a nitride liner (not shown) may be formed between the trench filling material and the material comprising the substrate 102. Other isolative techniques (e.g., field oxide) are also possible.

To form the structure of FIG. 1, a buffer layer 112 is formed over the substrate 102. The buffer layer 112 serves as stress relieving layer during subsequent processing, and it may comprise, for example, CVD silicon oxide. The buffer layer has thickness between about 1 and 50 nm, preferably about 10 nm. Formed on the buffer layer 112 is a hard mask layer 114, such as silicon nitride. The hard mask 114 is preferably a CVD nitride (e.g., $Si_3N_4$) and is formed to a thickness between about 10 and 500 nm. Formed over the hard mask 114 is resist 116, which may comprise, for example, a PC negative resist for a standard PC mask, or a PC positive resist on a PC inverted mask.

Figure 2A:
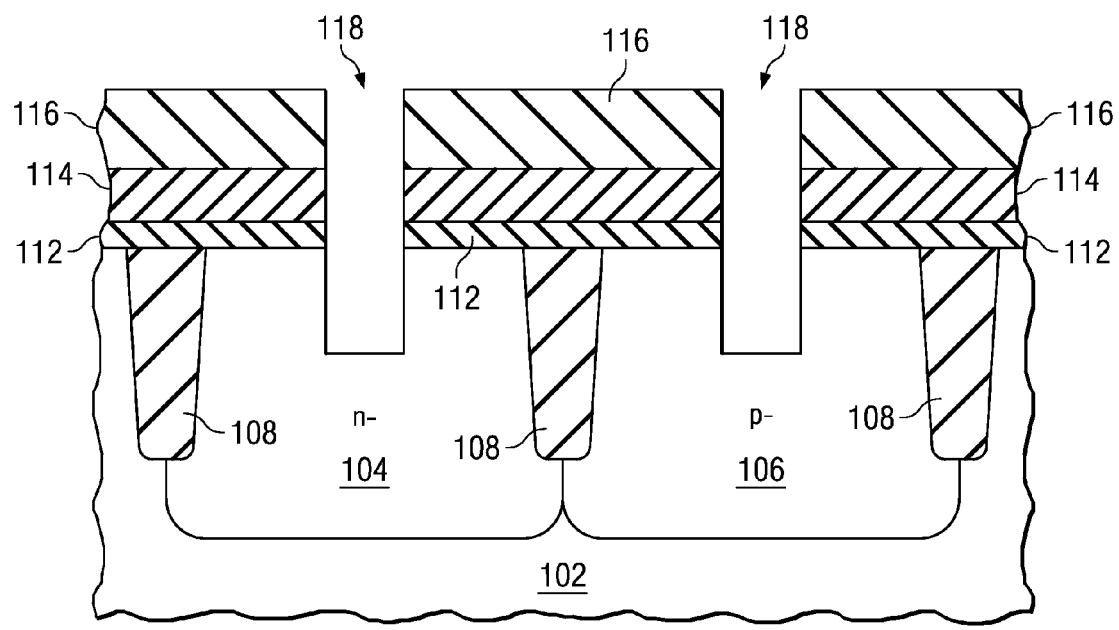
FIGS. 2A and 2B are side and plan views illustrating forming a recess in active regions and STI regions for a preferred buried gate transistor.

Turning now to FIG. 2a, there is the structure of FIG. 1 after forming a recess 118 in the surface of the substrate 102. Recesses 118 are formed, preferably at a depth between about 5 nm and about 200 nm. As illustrated in the plan view of FIG. 2b, preferred embodiments of the invention include simultaneously forming recess 118 in the portion of the isolation region 108 between interconnecting active regions 104/106/107. Simultaneously forming the recess 118 comprises a separate $SiO_2$ etchant, such as HF, that does not further attack the recessed Si.

Figure 2B:
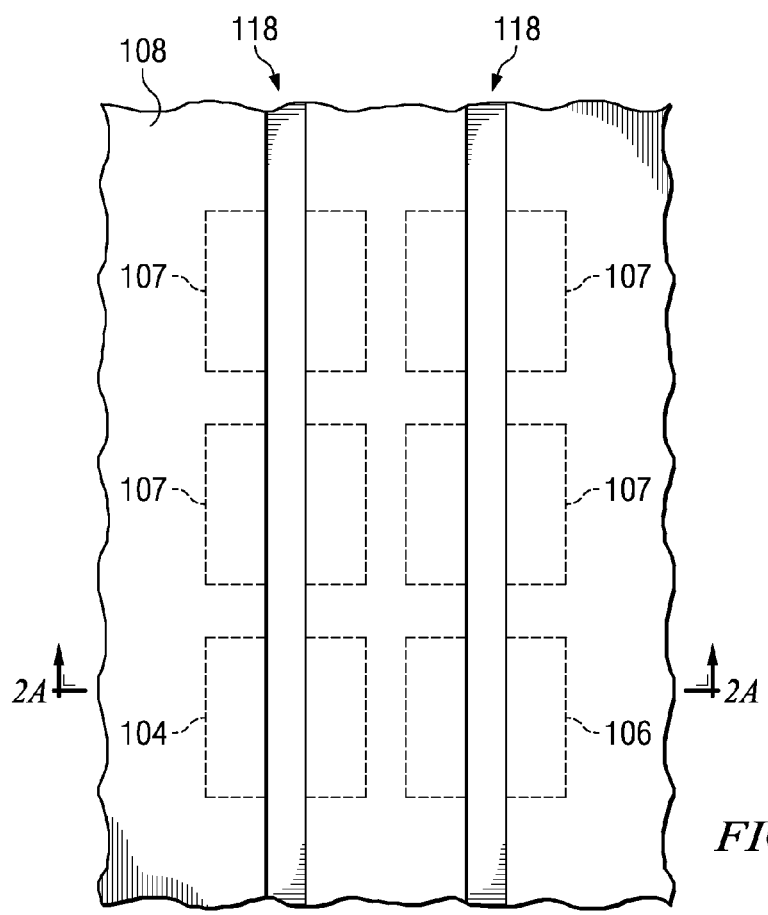
Figure 3:
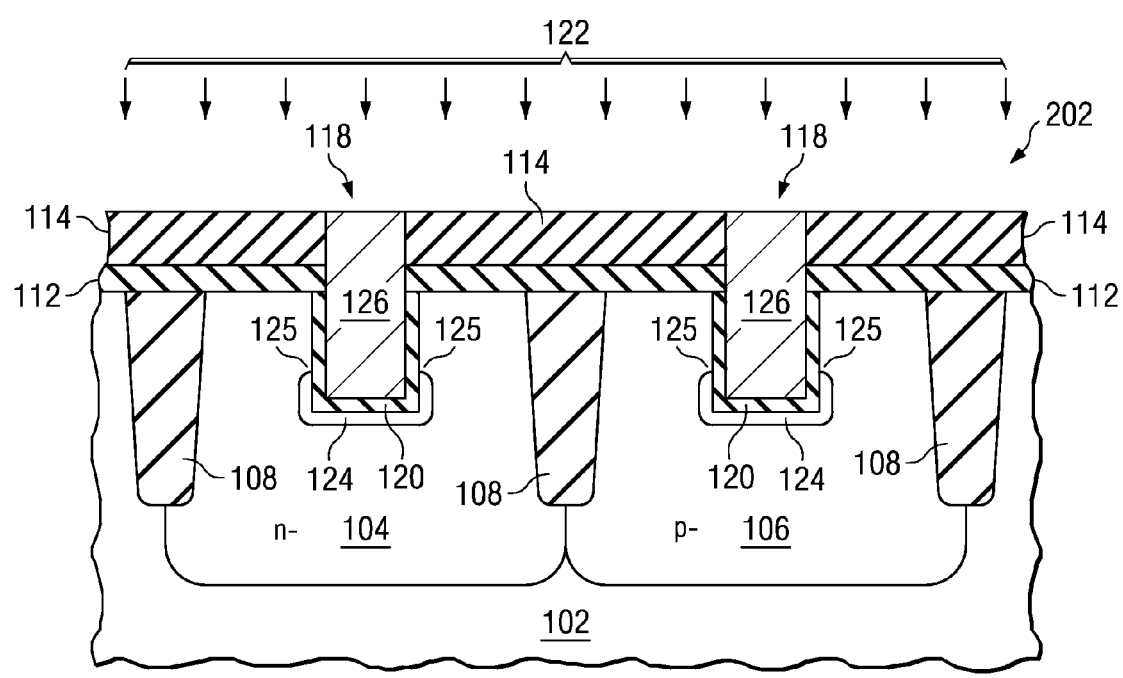
FIG. 3 is a side view illustrating forming the gate oxide and channel doping for a buried gate transistor.

Turning now to FIG. 3, there is illustrated the structure of FIGS. 2a and 2b after removing resist 116. A gate dielectric 120 is formed in the recess 118. Preferably, the gate dielectric 120 comprises a thermally grown oxide (e.g., $SiO_2$) between about 0.5 nm and 5 nm thick. It may also comprise a nitride (e.g., $Si_3N_4$), or combination of oxide and nitride (e.g., SiN, oxide-nitride-oxide sequence). In other embodiments, a high-k dielectric material having a dielectric constant of about 5.0 or greater, is used as the gate dielectric 120. Suitable high-k materials include $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 120 may comprise other high k insulating materials or other dielectric materials. The gate dielectric 120 may comprise a single layer of material, or alternatively, the gate dielectric 120 may comprise two or more layers.

The gate dielectric 120 may also be deposited by chemical vapor deposition (CVD), metal organic chemical vapor deposition (MOCVD), physical vapor deposition (PVD), atomic layer deposition (ALD), or jet vapor deposition (JVD), as examples.

After forming the gate dielectric 120 a shallow first dopant implant 122 forms a doped channel region 124. Because the shallow implant does not penetrate the hard mask 114, the highest dopant concentration is in the doped channel region 124, which is formed beneath the recess 118, as illustrated in FIG. 3. The doped channel region 124 modulates the threshold voltage for switching the transistor on and off.

Due to the geometry of the recess 118, the doping level at sidewall regions 125 of the recess 118 are doped to a lower level than directly underneath the recess 118. As will be described below in connection with preferred embodiments, the transistor source/drain (228) is formed to meet the doped channel region 124 near the sidewall regions 125 of the recess 118 where the channel doping concentration is lower. Since the source/drain 228 meets the channel at this lower channel doping at the sidewalls 125 (not under the lower gate oxide), junction capacitance, gate-induced barrier lowering, hot carrier generation and junction leakage are all improved.

Next, a gate electrode 126 is formed over the gate dielectric 120. The gate electrode 126 preferably comprises a semiconductor material, such as polysilicon or amorphous silicon, although alternatively, other semiconductor materials may be used for the gate electrode 126. In other embodiments, the gate electrode 126 may comprise polysilicon, TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 126 comprises a doped polysilicon layer underlying a silicide layer (e.g., titanium silicide, nickel silicide, tantalum silicide, cobalt silicide, platinum silicide).

If the gate electrode 126 comprises FUSI, for example, polysilicon may be deposited over the gate dielectric 120, and a metal such as nickel may be deposited over the polysilicon. Other metals, such as refractory metals Ta, Ti, Co, Pt, may alternatively be used. The substrate 102 may then be heated to about 600 or 700° C. to form a single layer of nickel silicide. The gate electrode 143 may comprise a plurality of stacked gate materials, such as, a metal underlayer with a polysilicon cap layer disposed over the metal underlayer. A gate electrode 126 between about 1000 to 2000 Å thick may be deposited using CVD, PVD, ALD, or other deposition techniques.

Next, excess polysilicon from forming gate electrode 126 is removed using CMP planarization. In preferred embodiments, the hard mask layer 114 is removed by wet etching, e.g. $HPO_3$. Preferably, the source/drain junction and poly doping implants are done before spacers are formed. This allows for better depth control of the source/drain at the gate oxide edge, as the buffer thickness is better controlled than the thickness of the remaining poly-Si or hard mask after the CMP and RIE as described. In this case, a new hard mask layer (e.g., a thin oxide then nitride, or nitride only) would be deposited and spacers formed as before preferably using a RIE. In other embodiments, the S/D can be done after the spacer is formed to allow deeper S/D regions away from the gate oxide sidewalls. In all cases, the buffer layer is kept to allow independent optimization of the relative depths of the source/drain and poly doping during implantation.

Figure 4:
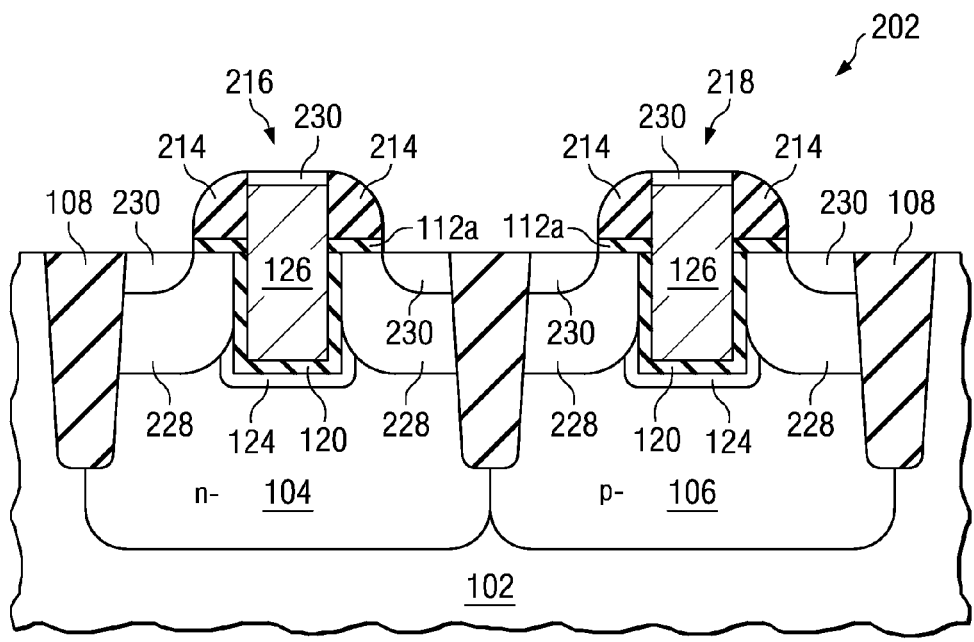
FIG. 4 is a side view of an embodiment of the invention illustrating forming sidewall spacers then source/drain regions including metal silicide.

Continuing with FIG. 4, there is further illustrated a CMOS device 202, which includes a p-channel transistor 216 and an n-channel transistor 218 preferably including the recessed gate electrodes 126. If the gate electrodes include a semiconductor, the semiconductor can be doped differently for the p-channel transistor 216 and the n-channel transistor 218. In both cases though the gate is preferably doped at the same time as the source/drain regions. In other embodiments, the different types of transistors can include gates of different materials.

Source/drain regions 228 can be formed in the n-well 104 and p-well 106. Preferably, ions (e.g., boron for the pMOS transistor 216 and arsenic and/or phosphorus for the nMOS transistor 218) are implanted, according to conventional methods to form heavily doped source/drain regions 228. The dopants can then be activated. For example, a conventional anneal, e.g. by a rapid thermal anneal (RTA) at about 1050° C., can be performed to activate the dopants and reduce implant damage.

For minimal SCEs, the source/drain regions 228 preferably do not extend past the level of the lower gate oxide, however in some circumstances this is possible depending on gate length restrictions. In the preferred cases, the highly-doped source/drain 228 meets the channel at a point where the gate oxide is not thicker than the gate oxide under the gate. This allows for maximum transistor performance due to minimized S/D-to-channel resistance.

A dielectric such as silicon nitride is deposited and shaped using a reactive ion etch to form spacers 214, as illustrated in FIG. 4. A portion of the buffer layer 112a remains and is used as an implant oxide for the implants in forming the source/drain regions 228.

A silicide 230 (e.g., nickel silicide) is formed over the source/drain regions 228 and the gate electrode 126. The silicide material 230 may be formed by chemical vapor deposition (CVD), physical vapor deposition, (PVD), or by another deposition means, as examples. The silicide 230 may comprise cobalt silicide, titanium silicide, tantalum silicide, platinum silicide, nickel platinum silicide, or other silicides, for example. Preferably, the deposition method used is selective such that no silicide 230 is formed over spacers 214.

In accordance with preferred embodiments of the invention, spacers 214 advantageously prevent the silicide 230 formed over the gate electrode 125 from bridging to the silicide 230 formed over the source/drain regions 228. Such an advantage follows, because the spacer can be made of the required width or height to ensure complete separation of the subsequent silicide formed on both areas. This is typically greater than about 20 nm width or height. As such, having no spacers here or relying on a thickened gate oxide (typically less than about 5 nm), will result in an unacceptably low silicide-to-silicide distance and cause silicide bridging, shorting a number of transistors in a circuit.

While not shown, it is understood that an interlayer dielectric (ILD) layer will be formed over the transistors 216 and 218. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethoxysilane (TEOS), as examples. Typically, gate electrode and source/drain contacts (not shown) are formed through the interlayer dielectric. Metallization layers that interconnect the various components are also included in the chip, but not illustrated for the purpose of simplicity.

To summarize, FIG. 4 illustrates an embodiment of the invention comprising semiconductor device such as a CMOS device. Embodiments also provide a method of forming such a device, wherein the method comprises forming an isolation region between a first and a second region in a substrate. Embodiments further comprise forming a recess in a surface of the first and second regions and in the isolation region and forming an oxide layer on a bottom recess surface and a pair of recess sidewalls. Embodiments also include doping a channel region in the first and second regions, depositing a gate electrode material in the recess, and forming source/drain regions adjacent the channel region in the first and second regions, after depositing the gate electrode material.

Figure 5A:
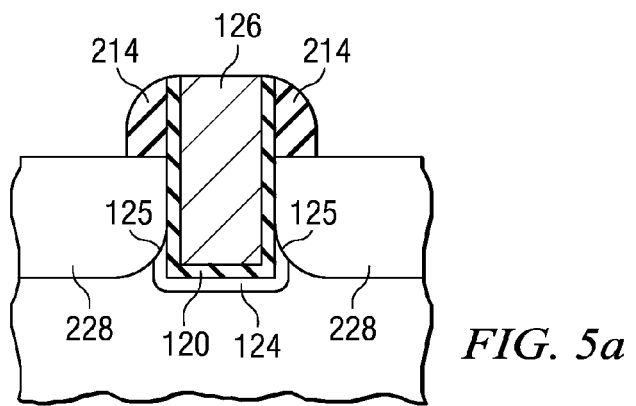
FIGS. 5a and 5b illustrate two of the advantages of embodiments of the invention.
Figure 5B:
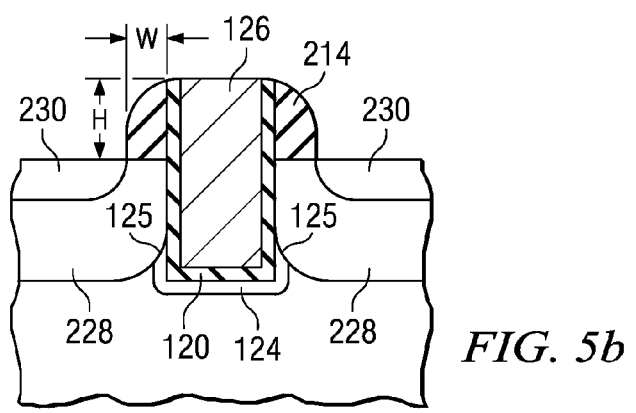

FIGS. 5a and 5b illustrate two advantages of embodiments of the invention. FIG. 5a illustrates that the heavily doped source/drain region 228 meets the channel 124 at a point where the gate dielectric (e.g., gate oxide) is at its thinnest. This point is indicated by the circle labeled 125. FIG. 5b illustrates that the height H of the gate electrode 126 above the surface of the semiconductor body and the width W of the spacer 214 can be adjusted to optimize the spacing between the silicide region 230 and the gate electrode 126. This feature will help avoid silicide bridging, which can create short circuits. These features, as well as other features described herein, can be combined or implemented individually in varying designs.

Figure 9A:
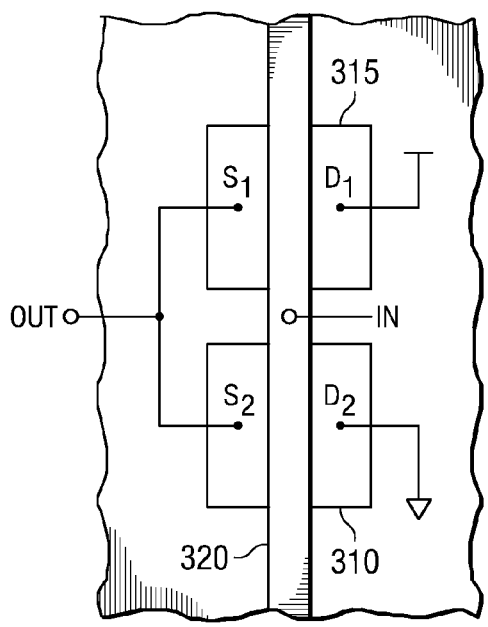
FIGS. 9a-9c illustrate a first implementation of a circuit using concepts of the invention.
Figure 9B:
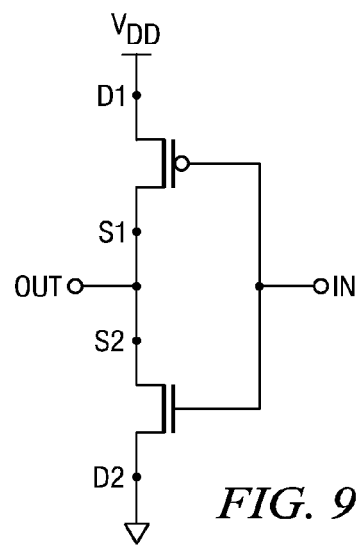
Figure 9C:
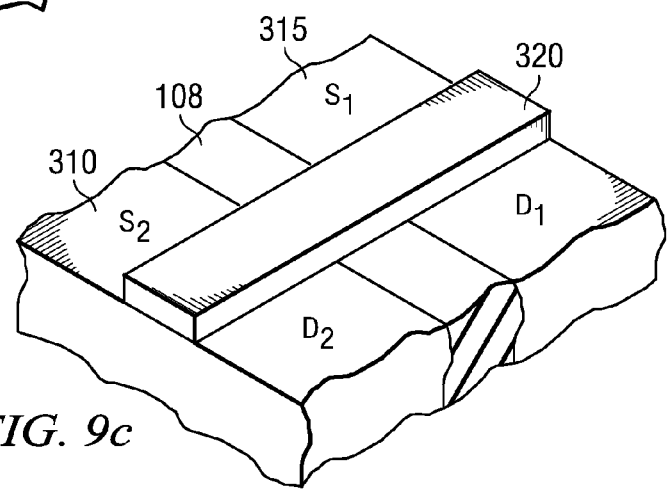

An exemplary implementation of the invention is illustrated in FIGS. 9a-9c. FIG. 9a is a plan view of an nFET 310 and a pFET 315, which together may comprise a component, namely a CMOS inverter, of an integrated circuit device. FIG. 9b is a circuit diagram of the structure illustrated in FIG. 9a. FIG. 9c provides a perspective view.

Figure 6:
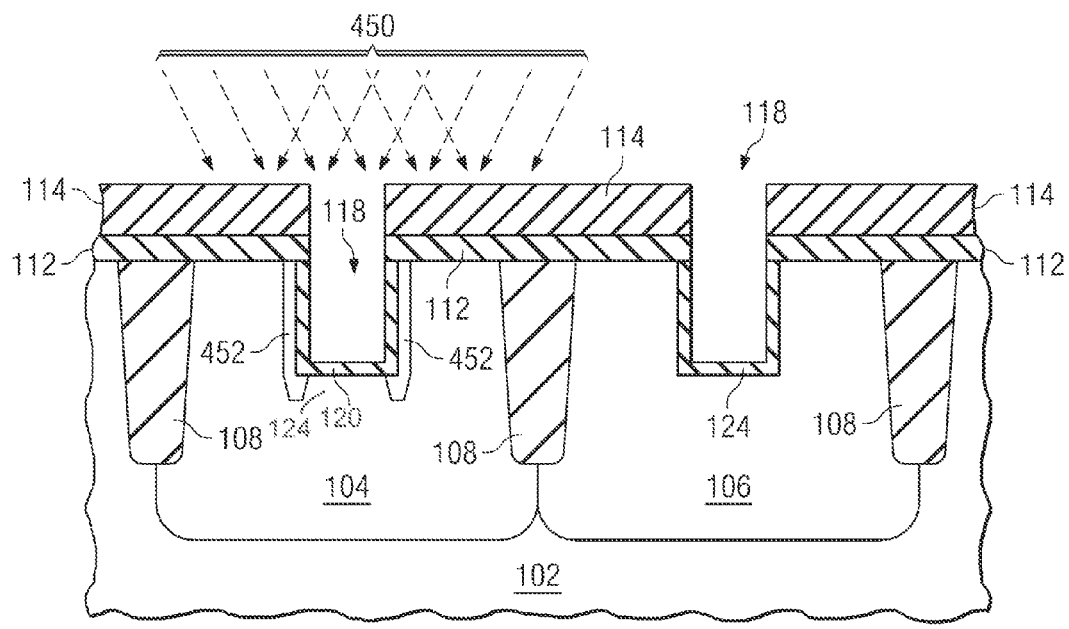
FIGS. 6-8 illustrate various alternate embodiments of the invention.
Figure 7:
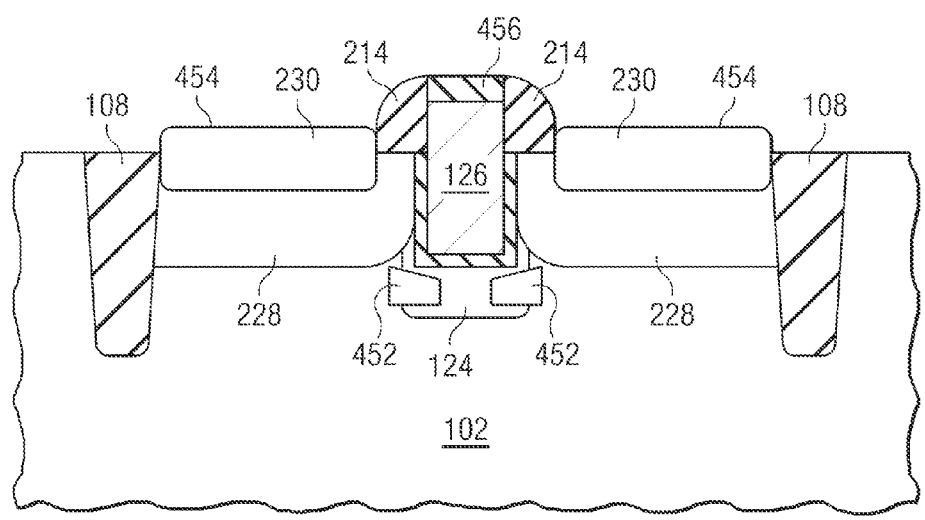
Figure 8:
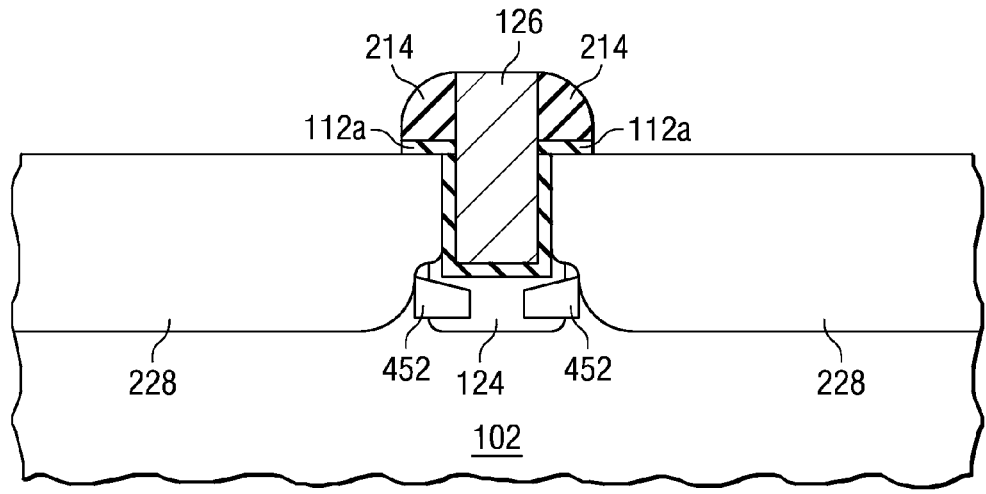

Additional features that can be incorporated with embodiments of the invention are shown in FIGS. 6-8. FIG. 6 can be used to illustrate the use of localized halo implantation using silicon recess shadowing. Halos are typically done in advanced devices to improve SCEs, i.e., to stop the threshold voltage from reducing due to the proximity of the source and drain. It is effectively a localized higher channel doping done only where the S/D meets the channel, i.e., having a relatively stronger effect for short channel devices.

In conventional devices, halos are implanted at an angle under the gate to reside at the gate edges. However, halos have to be implanted quite deep to prevent SCEs arising from the deeper regions of the S/D. This causes a wider spread in halo doping typically spreading into the bulk of the channel. This causes a reduction in channel current (mobility) due to excessive doping increasing carrier scattering in the channel.

In embodiments if the buried gate approach that utilize this feature, the halo implant 452, as illustrated by arrows 450 would be done immediately after the channel implant 124. Halo tilt would be tailored to the silicon recess and hard mask height, typically between 10 and 50 degs. The halo would comprise of two half-dose implants separated by a 180 deg wafer rotation. This halo implant is useful in advanced devices since gates are generally aligned in one direction due to lithography restrictions for high circuit density. The hard mask provides shadowing of the high-tilt halo implant allowing it to be implanted to the sides of the channel as desired while preventing it arriving in the majority of channel.

One major advantage over the conventional surface-gate approach is that the energy of the halo can be far shallower due to the lack of source/drain below the gate oxide level (no SCEs from source/drain). This allows greater control of the localization of the halo to improve SCEs and prevent mobility degradation. The nature of the source/drain being raised above the gate oxide level automatically relieves the dose requirements of the halo. As such, lower doses can be used and in combination with the reduced energy requirements, channel mobility is increased due to reduced doping levels in the channel.

FIG. 7 is provided to show an raised source/drain embodiment that can be used, for example, to optimize the overlap capacitance Coy. While higher Coy increases Ion, excessive Coy can increase circuit delay due to S/D-to-gate capacitance. To overcome this, the silicon (or other semiconductor material) recess can be tailored for desired Coy. However, for low Coy (i.e. little Si recess), there are problems with the source/drains being too shallow (e.g., the silicide cannot be allowed to punch through the source/drain).

The embodiment of FIG. 7 shows one example of the final formation of the buried gate. For smaller recess depths, an epitaxially deposited semiconductor layer 454, e.g., silicon, can be formed after buffer layer removal and before source/drain 228 implant to raise the silicide away from the bottom of the source/drain 228. In one embodiment, the epitaxially grown raised source/drain could be used with a shallow recess, e.g., one that is about 10 nm deep. If desired, the gate 126 may be capped with a dielectric 456, e.g., TEOS, to prevent silicon deposition on the gate during the epitaxial growth process. This cap 456 would be deposited on top of the gate 124 after CMP to hard mask and would be resistant to the subsequent hard mask wet etch.

This embodiment has a number of features. For example, the contact resistance and leakage are minimized. Another advantage is reduced silicide contact with gate oxide since spacers are higher, e.g., when the silicide is thicker. Further, the epitaxial silicon allows for a much easier implant for simultaneous source/drain and gate doping (e.g., the thicknesses can be more similar).

Another embodiment would be to deposit a further spacer layer, e.g. $Si_3N_4$, immediately on the hard mask after CMP. Preferably, the material is the same as the hard mask. As such, spacers can then be immediately formed by RIE of the hard mask/spacer material. The buffer layer would then be removed prior to S/D implant. As a result of this embodiment, the source/drain could be much deeper away from the gate oxide as it is at the gate oxide as shown in FIG. 8.

In accordance with preferred embodiments of the invention, the nFET 310 and pFET 315 devices are surrounded by an isolation structure 108, such as a shallow trench isolation region. As shown, source region S1 is spaced from drain region D1 by the gate electrode 320 and the source region S2 is spaced from the drain region D2 by the gate electrode 320. The gate electrode 320 is common to both transistor devices 310 and 315.

To form the inverter of FIG. 9b, the source region S1 is electrically coupled to the source region S2. This electrical connection can be made through metal (not shown) or a local interconnect (not shown), as examples. In addition, the drain region D1 is electrically coupled to a first supply voltage node, $V_{DD}$ in this case. The drain region D2 is electrically coupled to a second supply voltage node, ground in this case. These supply connections are typically made through a contact to metal (not shown).

Figure 10A:
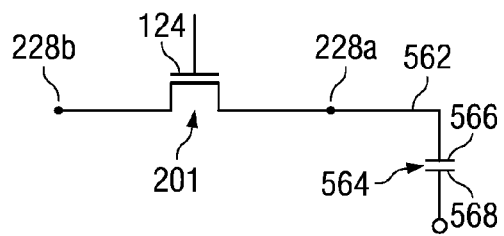
FIGS. 10a-10c illustrate a second implementation of a circuit using concepts of the invention.
Figure 10B:
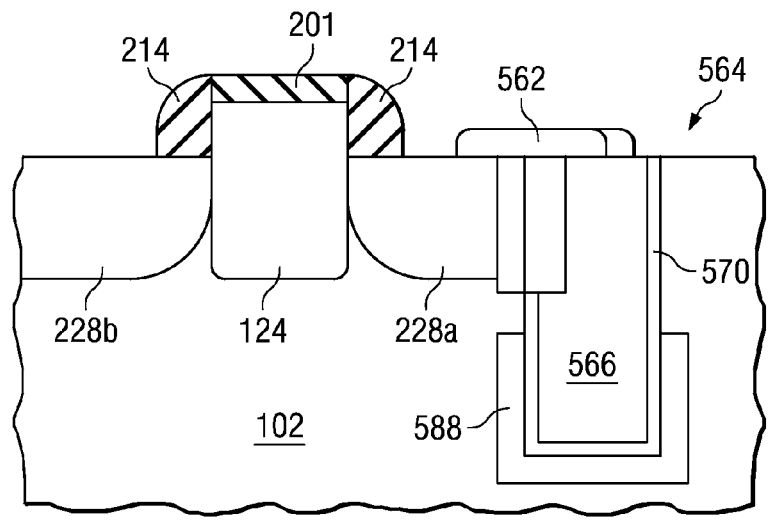
Figure 10C:
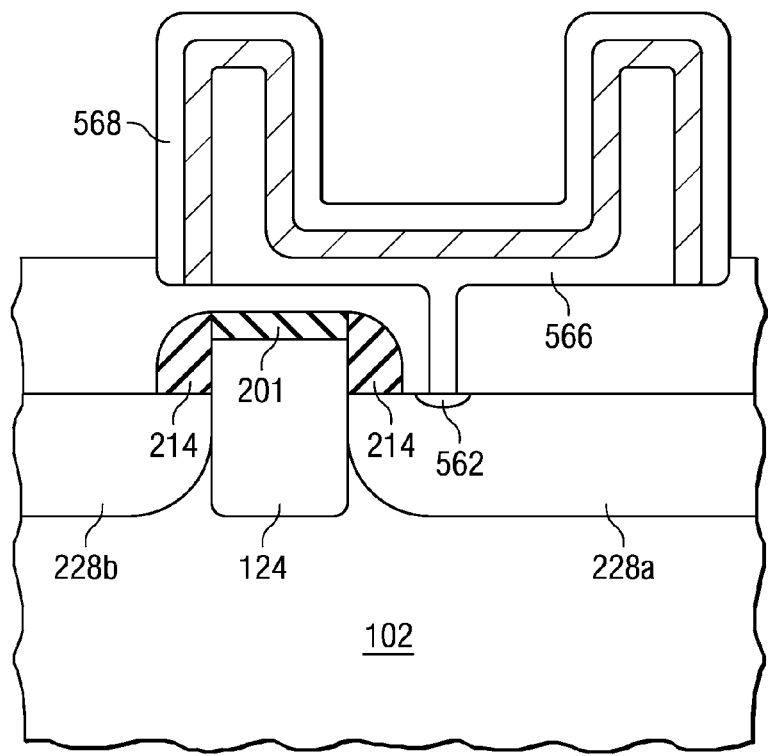

Another embodiment that can utilize concepts of the present is a memory cell such as a DRAM. FIG. 10a shows a schematic diagram of a DRAM cell that includes an access transistor 201 coupled in series with a storage capacitor 564. In this embodiment, the access transistor can be any embodiment buried gate transistor described above. FIGS. 10b and 10c provide two examples of memory cell structures that include the buried gate transistor described herein. In particular, FIG. 10b shows a trench capacitor embodiment and FIG. 10c shows a stack capacitor embodiment. The elements of FIGS. 10b and 10c have been labeled consistently with the schematic diagram of FIG. 10a.

Referring now to FIGS. 10a-10c, a buried gate transistor includes a first source/drain region 228b, which can be electrically coupled to a bit line (not shown). The gate 124 is electrically coupled to a word line (not shown). In a preferred implementation, the gate 124 can serve as the word line and span an entire row of memory cells in an array. (See e.g., FIG. 2, which shows a trench 118 for gate conductor that spans several active areas.) The word line can be silicided to reduce resistance and can optionally included a parallel metal conductor that straps to the gate conductor periodically to further reduce resistance.

The second source/drain 228a is electrically coupled to a first plate 566 of a capacitor 564. In the trench capacitor example (FIG. 10b), the first plate 566 is a conductor within the trench that is coupled to the source/drain region 228a via a strap 562. In the stack capacitor example (FIG. 10c), the first plate 566 is a first conductive layer coupled to the source/drain 228a via a highly conductive region 562 within substrate 102. The second plate 568 of the capacitor 564 is separated from the first plate 566 by a capacitor dielectric 570. In the trench capacitor example (FIG. 10b), the second plate 568 is a doped region within substrate 102. In the stack capacitor example (FIG. 10c), the second plate 568 is a second conductive layer that overlies the first conductive layer.

Although the present invention and its advantages have been described in detail, it should be understood that various changes, substitutions and alterations may be made herein without departing from the spirit and scope of the invention as defined by the appended claims. For example, it will be readily understood by those skilled in the art that materials and methods may be varied while remaining within the scope of the present invention. It is also appreciated, that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
   providing a semiconductor body with a first active region, a second active region, and an isolation region between the first active region and the second active region;
   forming a recess in a surface of the semiconductor body, the recess extending across the first active region, the isolation region and the second active region, the recess having a first depth from a top surface of the semiconductor body;
   forming a gate dielectric within the recess;
   forming doped channel regions in a bottom surface of the recess in the first and second active regions;
   forming a hard mask over the semiconductor body;
   implanting halo dopants to form halo regions along entire sidewalls of the recess after forming the doped channel regions in the first and second active regions, wherein, during the implanting, the hard mask shadows the halo dopants from reaching the bottom surface of the recess and a top surface of the semiconductor body adjacent the recess;
   forming a gate electrode in the recess;
   forming sidewall spacers adjacent the gate electrode; and
   after forming the sidewall spacers, forming first and second source/drain regions in the first active region and third and fourth source/drain regions in the second active region, the first source/drain region being spaced from the second source/drain region by the gate electrode and third source/drain region being spaced from the fourth source/drain region by the gate electrode, wherein the halo regions extend deeper than the first and second source/drain regions, wherein after forming the first and second source/drain regions, portions of the doped channel regions form a non-planar current channel for a transistor, wherein the non-planar current channel comprises a first portion along a side wall of the gate electrode, a second portion at a bottom surface of the gate electrode, and a third portion along an opposite sidewall of the gate electrode, wherein the halo regions intersect with the non-planar current channel.

2. The method of claim 1, wherein the first active region comprises an n-doped semiconductor and the second active region comprises a p-doped semiconductor.

3. The method of claim 1, further comprising:
   electrically coupling the first source/drain region to the third source/drain region;
   electrically coupling the second source/drain region to a first supply voltage node; and
   electrically coupling the fourth source/drain region to a second supply voltage node.

4. A method of making a buried gate, the method comprising:
   forming a recess in a surface of a semiconductor body, the recess having a first depth from a top surface of the semiconductor body;
   forming a high-k dielectric liner in the recess;
   forming a doped channel in a bottom surface of the recess;
   forming halo regions along sidewalls of the recess after forming the doped channel, wherein forming the halo regions along sidewalls of the recess comprises forming a hard mask over the semiconductor body, and implanting a halo implant along entire sidewalls of the recess, wherein the hard mask shadows the halo implant to reach the bottom surface of the recess and a top surface of the semiconductor body adjacent the recess;
   forming a gate electrode in the recess;
   forming sidewall spacers adjacent the gate electrode; and
   after forming the sidewall spacers, forming first and second highly doped source/drain regions in the semiconductor body, the first and second highly doped source/drain regions being laterally spaced by the gate electrode, wherein the halo regions extend deeper than the first and second highly doped source/drain regions, wherein after forming the first and second source/drain regions, portions of the doped channel form a non-planar current channel for a buried gate transistor, wherein the non-planar current channel comprises a first portion along a side wall of the gate electrode, a second portion at a bottom surface of the gate electrode, and a third portion along an opposite sidewall of the gate electrode, wherein the halo regions intersect with the non-planar current channel.

5. The method of claim 4, further comprising
depositing an epitaxial semiconductor layer before forming the first and second highly doped source/drain regions; and
siliciding the epitaxial semiconductor layer.

6. The method of claim 4, wherein the high-k dielectric liner is conformal along the bottom surface and along the sidewalls of the recess.

7. The method of claim 4, further comprising forming sidewalls spacers on a portion of the sidewalls of the gate electrode before forming the first and second highly doped source/drain regions.

8. A method of making a buried gate, the method comprising:
forming a recess in a surface of a semiconductor body, the recess having a first depth from a top surface of the semiconductor body;
forming a dielectric liner in the recess;
forming a doped channel in a bottom surface of the recess;
forming halo regions along sidewalls of the recess after forming the doped channel, wherein forming the halo regions along sidewalls of the recess comprises forming a hard mask over the semiconductor body, and implanting a halo implant along entire sidewalls of the recess, wherein the hard mask shadows the halo implant to reach the bottom surface of the recess and a top surface of the semiconductor body adjacent the recess;
forming a gate electrode in the recess;
forming sidewall spacers adjacent the gate electrode; and
after forming the sidewall spacers, forming first and second highly doped source/drain regions in the semiconductor body, the first and second highly doped source/drain regions being laterally spaced by the gate electrode, wherein the halo regions extend deeper than the first and second highly doped source/drain regions, wherein after forming the first and second source/drain regions, portions of the doped channel form a non-planar current channel for a buried gate transistor, wherein the non-planar current channel comprises a first portion along a side wall of the gate electrode, a second portion at a bottom surface of the gate electrode, and a third portion along an opposite sidewall of the gate electrode, wherein the halo regions intersect with the non-planar current channel.

9. The method of claim 8, wherein forming the recess comprises lithographically patterning and etching the recess between about 5 nm and about 200 nm.

10. The method of claim 8, wherein forming the dielectric liner comprises thermally growing an oxide layer.

11. The method of claim 8, wherein forming the gate electrode comprises forming a buried gate electrode that extends out of an active region, the method further comprising:
forming sidewall spacers along sidewalls of the gate electrode on the top surface of the semiconductor body; and
forming a silicide over the first and second source/drain regions, the silicide being laterally spaced from the gate electrode by the sidewall spacers.

12. The method of claim 8, where the halo regions are implanted using a tilt angle implant that uses the recess and geometry of the hard mask to shadow, and thereby localize, the implant solely at edges of a channel while avoiding implant in bulk of the channel.

13. The method of claim 8, further comprising forming a first raised source/drain region over the first source/drain region and a second raised source/drain region over the second source/drain region.

* * * * *